United States Patent [19]
Martens

[11] Patent Number: 5,864,571
[45] Date of Patent: Jan. 26, 1999

[54] ERROR DETECTION CIRCUIT USING TWO BIT TO FOUR BIT ENCODER

[75] Inventor: David James Martens, Austin, Tex.

[73] Assignee: International Business Machines Corporation, Armonk, N.Y.

[21] Appl. No.: 763,485

[22] Filed: Dec. 11, 1996

[51] Int. Cl.$^6$ .................................................. H03M 13/02
[52] U.S. Cl. .................................... 371/52; 340/146.2
[58] Field of Search ................................ 371/52, 63, 65, 371/67.1, 48; 340/146.2; 395/185.02, 185.03, 185.01

[56] References Cited

U.S. PATENT DOCUMENTS

| | | |
|---|---|---|
| 4,890,148 | 12/1989 | Ikeda et al. ............................. 357/454 |
| 4,953,164 | 8/1990 | Asakura et al. ....................... 371/40.1 |
| 4,965,828 | 10/1990 | Ergott, Jr. et al. ....................... 381/50 |
| 5,122,846 | 6/1992 | Haken .................................. 357/23.4 |
| 5,124,770 | 6/1992 | Umemoto et al. ....................... 357/22 |
| 5,144,305 | 9/1992 | Götz et al. ............................. 341/73 |
| 5,339,408 | 8/1994 | Bruckert et al. ....................... 395/575 |
| 5,668,525 | 9/1997 | Chiu et al. ............................ 340/146.2 |

*Primary Examiner*—Phung M. Chung
*Attorney, Agent, or Firm*—Winstead Sechrest & Minick P.C.; Anthony V. S. England

[57] ABSTRACT

An error detection circuit detects single bit errors in arrays containing information encoded in 2B format. The circuit checks for any error where a single bit has been corrupted and detects some types of multiple bit corruptions.

10 Claims, 2 Drawing Sheets

FIG. 1

2 BIT TO 4 BIT ENCODING

| INPUT BITS | | | OUTPUT BITS | | | |
|---|---|---|---|---|---|---|
| $S_1$ | $S_0$ | | $A_3$ | $A_2$ | $A_1$ | $A_0$ |
| 0 | 0 | → | 0 | 0 | 0 | 1 |
| 0 | 1 | → | 0 | 0 | 1 | 0 |
| 1 | 0 | → | 0 | 1 | 0 | 0 |
| 1 | 1 | → | 1 | 0 | 0 | 0 |

FIG. 2

COMPLEMENT BIT GENERATION

| INPUT BITS | OUTPUT BITS |
|---|---|
| $A_3$ | $\overline{A_3}$ |
| $A_2$ | $\overline{A_2}$ |
| $A_1$ | $\overline{A_1}$ |
| $A_0$ | $\overline{A_0}$ |

…

ERROR DETECTION CIRCUIT USING TWO BIT TO FOUR BIT ENCODER

CROSS REFERENCES TO RELATED APPLICATIONS

U.S. patent application Ser. No. 08/697,099, COMPARATOR CIRCUIT USING TWO-BIT TO FOUR-BIT ENCODER (DOCKET NO. AA9-96-026), INCORPORATED HEREIN BY REFERENCE U.S. patent application Ser. No. 08/770,220, BLOCK ADDRESS TRANSLATION CIRCUIT USING TWO-BIT TO FOUR-BIT ENCODER (DOCKET NO. AT9-96-202), INCORPORATED HEREIN BY REFERENCE U.S. patent application Ser. No. 08/772,215, REGISTER FILE ARRAY USING TWO-BIT TO FOUR-BIT ENCODER (DOCKET NO. AT9-96-196), INCORPORATED HEREIN BY REFERENCE

FIELD OF THE INVENTION

The present invention relates to information handling systems and, in particular, to error detection circuits for use therein to detect errors in binary logic bits.

BACKGROUND OF THE INVENTION

As transistor sizes continue to decrease with each process technology improvement, circuits based on these smaller transistors become increasingly susceptible to a phenomenon known as soft errors. The term soft error describes a situation where the circuit environment is disrupted on a local level due to the introduction of a spurious charged particle from sources external to the circuit in question. Generally speaking, this problem will occur when an alpha particle strikes a portion of a circuit after passing through the protective packaging of the chip and other protective materials covering an active circuit area. Unfortunately, it is not possible to completely eliminate the possibility that a soft error may occur. It is, however, possible, through circuit techniques, to greatly reduce the statistical likelihood that a soft error will occur within some length of time. By using design techniques to reduce the probability of soft errors while also including a circuit that will provide soft error detection, the problems associated with these random circuit failures can be minimized. In the present invention, a circuit is provided for performing the task of determining whether information corruption has occurred when this information has been stored in an array using a 2B encoded format to be described herein.

It is statistically unlikely that any single circuit (i.e., one SRAM cell) will be subject to a soft error within the time period of a few years. However, it can be mathematically established that within some large group of circuits (that might be implemented on a contemporary microprocessor), a minimum of one soft error will occur within the time period of several years (for a transistor process technology that would be considered current state-of-the-art). A practical example of this situation is any array of SRAM memory cells. It is very likely that one or more cells within an array of ten thousand SRAM cells being changed due to a soft error condition over a long period of continuous device operation will occur. From the standpoint of the microprocessor in which these soft errors are occurring, the result of the soft error can vary in effect, from a simple data corruption that has little or no impact, to a major problem resulting in a significant change in the microprocessor's operating characteristics. Based on the probabilities described, it can be seen that soft errors must be anticipated and that their impact can be significant.

The process of detecting memory corruption may be dependent on the format of the data being stored in the array. One such format is the 2B encoded format. What is needed is an error detection circuit for detecting an error in information in 2B encoded format.

SUMMARY OF THE INVENTION

Accordingly, the present invention provides a circuit for detecting an error in binary logic bits. The circuit includes circuitry for encoding a set of binary logic bits into a corresponding set wherein only one bit of the encoded set has a predefined logic state and circuitry for comparing bits of the encoded set to determine if only one bit of the encoded set has the predefined logic state.

The present invention is also directed to a method for detecting an error in binary logic bits comprising the steps of encoding a set of binary logic bits into a corresponding set wherein only one bit of the encoded set has a predefined logic state and comparing bits of the encoded set to determine if only one bit of the encoded set has the predefined logic state.

The primary advantage of the present invention is the provision of an error detection circuit for detecting an error in binary logic bits which works with signals encoded in a scheme other than true and complement or dual rail format.

Another advantage to the present invention is the provision of an error detection circuit for detecting an error in binary logic bits which is faster than the prior art error detection circuits, consumes less power than the prior art error detection circuits, and has greater noise immunity than prior art error detection circuits.

BRIEF DESCRIPTION OF THE DRAWINGS

FIG. 1 illustrates the two bit to four bit encoding scheme utilized in the present invention.

FIG. 2 illustrates complement bit generation utilized in the present invention.

DETAILED DESCRIPTION OF A PREFERRED EMBODIMENT OF THE INVENTION

Figure 3:
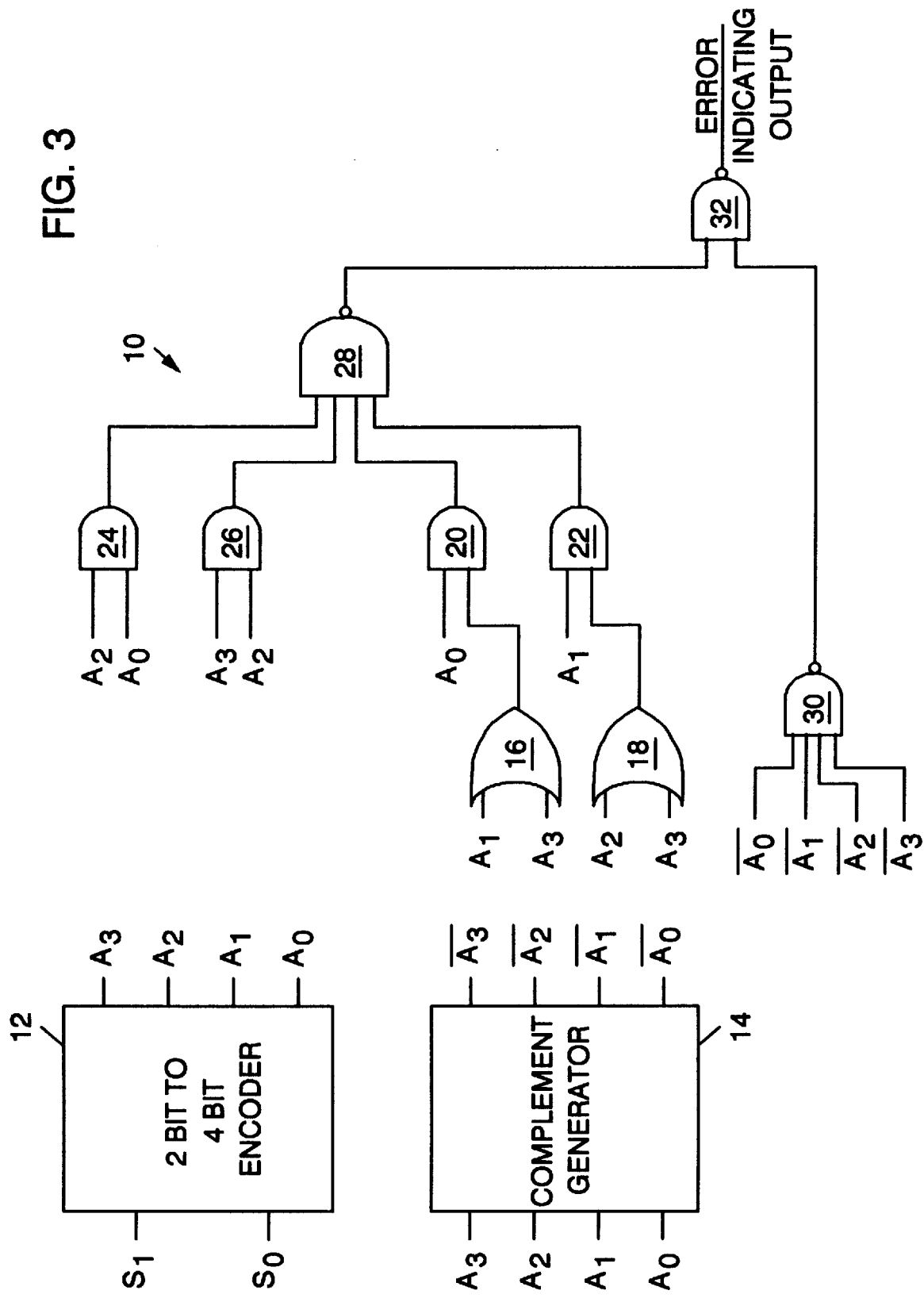
FIG. 3 is a schematic block diagram of a circuit for detecting an error in binary logic bits according to the present invention.

Generally, the present invention provides error detection circuits for detecting errors in binary logic bits wherein each two bits of the binary logic bits are encoded into a four bit representation. The error detection circuit of the present invention is specifically designed to work only with such a two to four bit encoding scheme and take advantage of the encoding scheme to achieve faster error detection than the prior art.

Specifically, the error detection circuit of the present invention is designed to work with the encoding scheme illustrated in FIGS. 1 and 2. Referring to FIG. 1, the two bit to four bit encoding scheme referred to as 2B encoding or 2B encoded format is shown wherein a signal comprising two or more bits is encoded according to the scheme depicted in FIG. 1. The binary logic bits of the signal are grouped into sets of two binary logic bits S0, S1. The bits S0, S1 are then encoded into a four bit representation comprising output bits A0, A1, A2, and A3 as illustrated in FIG. 1. FIG. 2 illustrates the well known complement generation of input bits A0, A1, A2 and A3. The output bits are $\overline{A3}, \overline{A2}, \overline{A1}$, and $\overline{A0}$. FIGS. 1 and 2 provide only one example to illustrate the present invention. It will be appreciated that a signal having any number of bits equal to or greater than two may be utilized with the present invention.

Referring to FIG. 3, an error detection circuit 10 for detecting an error in binary logic bits according to the present invention as shown for purposes of example only, a signal having two bits, S0 and S1, as set forth in FIGS. 1 and 2 is inputted into circuit 10 to determine whether an error or corruption in bits S0, S1 has occurred. Error detection circuit 10 includes the two bit to four bit encoder 12. Encoder 12 has as inputs bits S0 and S1 and as outputs bits A0, A1, A2 and A3. In this manner, encoder 12 is a two-bit to four-bit encoder which maps bits S0, S1 into A0, A1, A2 and A3 according to the encoding scheme set forth in FIG. 1. For example, if bits S1 and S0 are 0 bits, bits A3, A2 and A1 will be 0 and bit A0 will be 1. It is to be noted that only one of the four bits outputted from encoder 12 is in the high state or on state (i.e., logical 1) at any one time. Bits A0, A1, A2 and A3 are inputted into complement generator 14 which produces complements $\overline{A0}, \overline{A1}, \overline{A2},$ and $\overline{A3}$. In other words, complement generator 14 maps bits A0, A1, A2 and A3 into bits $\overline{A0}, \overline{A1}, \overline{A2},$ and $\overline{A3}$ according to the encoding/mapping scheme set forth in FIG. 2.

It is to be noted that any number of two bit to four bit encoders and complement generators may be employed to accommodate signals having any number of bits greater than or equal to two bits. Error detection circuit 10 further includes OR gates 16, 18. OR gate 16 ORs bits A1 and A3 and OR gate 18 ORs bits A2 and A3. The output of OR gate 16 is coupled to the input of an AND gate 20 for ANDing the output of OR gate 16 with bit A0. The output of OR gate 18 is coupled to the input of an AND gate 22 for ANDing the output of OR gate 18 with bit A1. Error detection circuit 10 further includes AND gate 24 for ANDing bits A2 and A0 and AND gate 26 for ANDing bits A3 and A2. The output of AND gates 20, 22, 24 and 26 are coupled to the inputs of a NAND gate 28 for NANDing the outputs of AND gates 20, 22, 24, 26. A second NAND gate 30 is provided for NANDing bits $\overline{A0}, \overline{A1}, \overline{A2},$ and $\overline{A3}$. The outputs of second NAND gate 30 and first NAND gate 28 are coupled to the inputs of a third NAND gate 32 for NANDing the outputs of first NAND gate 28 and second NAND gate 30.

Although the present invention and its advantages have been described in detail, it should be understood that various changes, substitutions and alterations can be made herein without departing from the spirit or scope of the invention as defined in the appended claims.

What is claimed is:

1. A circuit for detecting an error in binary logic bits, said circuit comprising:

means for encoding a set of binary logic bits into corresponding set wherein only one bit of said encoded set has a predefined logic state; and means for comparing bits of said encoded set to each other to determine if only one bit of said encoded set has said predefined logic state, wherein said means for encoding includes means for grouping a set of binary logic bits into sets of two logic bits, wherein said means for encoding includes means for encoding said sets of two logic bits into corresponding encoded sets of four logic bits wherein only one of the four logic bits is in an on state, wherein said encoded sets of four logic bits include bits A0, A1, A2, and A3, wherein said means for comparing comprises a NAND gate for NANDing the complement of bits A0, A1, A2, and A3 wherein the output of said NAND gate indicates whether no bits are in said on state.

2. The circuit, as recited in claim 1, further including means for indicating an error if two or more bits or no bits of said encoded set have said predefined logic state.

3. A circuit for detecting an error in binary logic bits, said circuit comprising;

means for encoding a set of binary logic bits into a corresponding set wherein only one bit of said encoded set has a predefined logic state; and means for comparing bits of said encoded set to each other to determine if only one bit of said encoded set has said predefined logic state, wherein said means for encoding includes means for grouping a set of binary logic bits into sets of two logic bits, wherein said means for encoding includes means for encoding said sets of two logic bits into corresponding encoded sets of four logic bits wherein only one of the four logic bits is in an on state, wherein said encoded sets of four logic bits include bits A0, A1, A2, and A3, wherein said means for comparing comprises:

a first AND gate and ANDing bits A0 and A2;
   a second AND gate for ANDing bits A2 and A3;
   a first OR gate for ORing bits A1 and A3;
   a third AND gate for ANDing the output of said OR gate with bit A0; and
   a fourth AND gate for ANDing the output of said second OR gate with bit A1.

4. The circuit, as recited in claim 3, wherein said means for comparing further comprises a NAND gate for NANDing the outputs of said first, second, third and fourth AND gates wherein the output of said NAND gate indicates whether two or more bits are in said on state.

5. The circuit, as recited in claim 3, wherein said means for comparing further comprises:

a first NAND gate for NANDing the outputs of said first, second, third and fourth AND gates;
   a second NAND gate for NANDing the complement of bits A0, A1, A2 and A3 wherein the output of said first NAND gate indicates whether no bits are in said on state; and
   a third NAND gate for NANDing the output of said first NAND gate and the output of said second NAND gate.

6. A method for detecting an error in binary logic bits, said method comprising the steps of encoding a set of binary logic bits into a corresponding set wherein only one bit of the encoded set has a predefined logic state; and comparing bits of the encoded set to each other to determine if only one bit of the encoded set has the predefined logic state, further including the step of grouping a set of binary logic bits into sets of two logic bits, wherein said step of encoding further includes the step of encoding the sets of two logic bits into corresponding encoded sets of four logic bits wherein only one of the four logic bits is in an on state, wherein the encoded sets of four logic bits include bits A0, A1, A2 and A3, wherein said step of comparing further includes the step of providing a NAND gate for NANDing the complement of bits A0, A1, A2 and A3, wherein the output of the NAND gate indicates whether no bits are in the on state.

7. The method, as recited in claim 6, further comprising a step of indicating an error if two or more bits or no bits of the encoded set have the predefined logic state.

8. A method for detecting an error in binary logic bits, said method comprising the steps of encoding a set of binary logic bits into a corresponding set wherein only one bit of the encoded set has a predefined logic state; and comparing bits of the encoded set to each other to determine if only one bit of the encoded set has the predefined logic state, further including the step of grouping a set of binary logic bits into sets of two logic bits, wherein said step of encoding further includes the step of encoding the sets of two logic bits into corresponding encoded sets of four logic bits wherein only one of the four logic bits is in an on state, wherein the encoded sets of four logic bits include bits A0, A1, A2, and A3, wherein said step of comparing includes steps of providing:

a first AND gate for ANDing bits A0 and A2;

a second AND gate for ANDing bits A2 and A3;

a first OR gate for ORing bits A1 and A3;

a second OR gate for ORing bits A2 and A3;

a third AND gate for ANDing the output of the first OR gate with bit A0; and a fourth AND gate for ANDing the output of the second OR gate with bit A1.

9. The method, as recited in claim 8, wherein said step of comparing further includes the step of providing a NAND gate for NANDing the outputs of the first, second, third and fourth AND gates wherein the output of the NAND gate indicates whether two or more bits are in the on state.

10. The method, as recited in claim 8, wherein said step of comparing further comprises the step of providing a first NAND gate for NANDing the outputs of the first, second, third and fourth AND gates; a second NAND gate for NANDing the complement of bits A0, A1, A2 and A3 wherein the output of the first NAND gate indicates whether no bits are in the on state; and a third NAND gate for NANDing the output of the first NAND gate and the output of the second NAND gate.

* * * * *

UNITED STATES PATENT AND TRADEMARK OFFICE
CERTIFICATE OF CORRECTION

PATENT NO. : 5,864,571
DATED : January 26, 1999
INVENTOR(S) : Martens

It is certified that error appears in the above-identified patent and that said Letters Patent is hereby corrected as shown below:

Column 3, Line 46 after "Binary logic bits into", insert a
Column 3, Line 67 after "circuit comprising" delete [;] and insert :
Column 4, Line 15 after "first AND gate" delete [and] and insert for; and
Column 4, Line 17, after "bits A1 and A3;" insert _
   a second OR gate for ORing bits A2 and A3;

Signed and Sealed this

Sixteenth Day of January, 2001

Attest:

Q. TODD DICKINSON

Attesting Officer    Commissioner of Patents and Trademarks